(12) United States Patent
Kaja et al.

(10) Patent No.: US 6,329,609 B1
(45) Date of Patent: Dec. 11, 2001

(54) METHOD AND STRUCTURE TO PREVENT DISTORTION AND EXPANSION OF ORGANIC SPACER LAYER FOR THIN FILM TRANSFER-JOIN TECHNOLOGY

(75) Inventors: Suryanarayana Kaja, Hopewell Junction; Chandrika Prasad, Wappingers Falls; RongQing Yu, Poughkeepsie, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/607,098

(22) Filed: Jun. 29, 2000

(51) Int. Cl.[7] ........................................................ H01R 9/09
(52) U.S. Cl. ........................... 174/262; 174/260; 174/261; 361/767; 361/770; 361/773; 438/618; 439/64
(58) Field of Search ................................. 174/262, 261, 174/260; 361/760, 773, 774, 770, 767; 439/64, 65; 428/209, 618, 637

(56) References Cited

U.S. PATENT DOCUMENTS

| | | |
|---|---|---|
| 4,783,722 | 11/1988 | Osaki et al. . |
| 4,889,790 | 12/1989 | Roos et al. . |
| 4,992,354 | 2/1991 | Axon et al. . |
| 5,039,628 | 8/1991 | Carey . |
| 5,213,945 | 5/1993 | Roos et al. . |
| 5,310,967 | 5/1994 | Chalco et al. . |
| 5,386,624 | 2/1995 | George et al. . |
| 5,412,537 * | 5/1995 | Magill et al. ......................... 361/767 |
| 5,716,222 | 2/1998 | Murphy . |
| 5,848,466 | 12/1998 | Viza et al. . |
| 5,866,441 | 2/1999 | Pace . |
| 5,870,822 | 2/1999 | Drake et al. . |
| 5,909,634 | 6/1999 | Hotchkiss et al. . |
| 5,915,753 | 6/1999 | Motomura et al. . |
| 6,178,082 * | 1/2001 | Farooq et al. ........................ 361/763 |
| 6,215,321 * | 4/2001 | Nakata ................................. 428/209 |
| 6,261,941 * | 7/2001 | Li et al. ................................ 438/618 |

* cited by examiner

*Primary Examiner*—Albert W. Paladini
(74) *Attorney, Agent, or Firm*—DeLio & Peterson, LLC; John J. Tomaszewski; Ira D. Blecker

(57) ABSTRACT

An electronic component structure assembly comprising a thin film structure bonded to a multilayer ceramic substrate (MLC) using solder connections and wherein a non-conductive, compliant spacer preferably with a layer of thermoplastic adhesive on each surface thereof is interposed between the underlying MLC carrier and overlying thin film structure. The spacer includes a pattern of through-holes which corresponds to opposing contact pads of the thin film structure and MLC. The contact pads of at least one of the thin film structure or MLC have posts (e.g., metallic) thereon and the posts extend partly into the spacer through-holes whereby the height of the posts are greater than the thickness of the adhesive. The posts of the MLC have solder bumps thereon. After reflow under pressure the thin film structure is electrically and mechanically connected to the MLC and the join method has been found to provide a reliable and cost-effective process. The joined components also have enhanced operating life.

15 Claims, 3 Drawing Sheets

METHOD AND STRUCTURE TO PREVENT DISTORTION AND EXPANSION OF ORGANIC SPACER LAYER FOR THIN FILM TRANSFER-JOIN TECHNOLOGY

BACKGROUND OF THE INVENTION

1. Field of the Invention

The present invention relates generally to electronic device assemblies wherein one electronic component is mechanically and electrically bonded to another electronic component and, more particularly, to assemblies comprising a copper-polyimide "thin film" electronic component structure and a multilayer ceramic substrate electronic component structure with an organic spacer between the components to align the contact pads of each component, which structures are mechanically and electrically bonded together by solder reflow and to a method for making the assembly without defective solder connections and increased reliability and cost-effectiveness of the manufacturing process.

2. Description of Related Art

In an electronic assembly such as a multi-chip module (MCM), a matrix of electronic devices, typically chips, are generally mounted on a multi-layer ceramic (MLC) carrier. One of the main functions of such an MLC carrier is to interconnect the chips or other electronic devices mounted to the carrier ("top-to-top" connections) and to interconnect such chips to the input-output or I/O connections of the carrier board ("top-to-bottom" connections).

For a variety of performance as well as manufacturing reasons, including cost and yield concerns, it is desirable to limit the number of MLC layers. One solution of the current art is to use "thin film electronic components," generally made of layers of polyimide, polymeric material, or other organic material having a low dielectric constant with the layers having copper wiring and interconnecting vias. Typically, the thin film is secured to one of the planar surfaces of the MLC carrier and appropriate interconnections are made between the opposing, "mating" surfaces of the thin film and the MLC carrier. A typical thin film structure, like a MLC, contains a number of interconnections using vias, contact pads and connecting conductor straps. Typically, both surfaces of the thin film structure contain contact pads for connecting the thin film package to the MLC component on one side of the thin film structure and/or chips on the other side of the structure.

The use of thin films also enhances the ability to repair certain defects in the resulting MLC carrier. Furthermore, the polyimide material and copper lines and vias of a thin film interconnect generally produce better electrical performance than the typical MLC carrier. As such, thin film technology has been a critical part of high-performance interconnect carriers for almost all MCMs.

The prior art processes of achieving active pad connections with thin film components have drawbacks and disadvantages however. In particular, the thin film structure is typically formed on a sacrificial carrier, typically glass according to prior art techniques, and the thin film is released from the carrier in a free-standing form by using suitable laser techniques. The thin film is held after release in its free-standing form by a ring or frame which engages the edges of the thin film. The free-standing thin film is then laminated to an MLC carrier or module with its pads aligned with the pads of the MLC. The pad connections between the thin film and the MLC carrier are achieved typically by gold, thermo-compression bonding.

Many of the drawbacks and disadvantages of this approach relate to the fact that the thin film is released from its sacrificial carrier in a free-standing form before lamination joining with the MLC. When the thin film is thus released, its internal stress generally will cause it to shrink, often by over 0.2% depending on the number of levels of the thin film structure. The shrinkage of the thin film makes it difficult to align the pads and other electrical connections of the thin film to the corresponding MLC carrier. Such shrinkage, and even distortion, are exacerbated if the thin film structure is released from its sacrificial carrier too soon in the manufacturing process. The solution of holding the thin film around its edges with a ring or frame after release has the additional disadvantage of reducing the active thin film structure area.

In another application semiconductor chips are attached to laminate substrates, such as printed circuit boards, rather than to MLC modules. A consistent obstacle in attaching chips to laminate substrates is the mismatch of the thermal coefficient of expansion, or TCE, between the chips and the laminated boards or substrates. This problem is especially acute in the case of direct chip attach. Direct chip attach, or DCA, is a growing trend in the microelectronics industry for many applications. Direct chip attach involves attaching semiconductors directly to a laminate substrate such as a printed circuit board or card.

Regardless of the electronic components being joined, the mismatch of TCE between the two components generates shear stress on the electrical connections between the components and such shear stresses result in fatigue of the connections over the life of the product, making those connections prone to failure. In addition, the difference in the TCE applies bending forces to the components at their outer edges and, therefore, may cause the components to crack.

One attempted solution to alleviate the problems caused by the difference in TCE is to inject an underfill epoxy between the components after the solder is joined. The underfill also imparts increased rigidity to resist bending moments which would otherwise be applied to the component. Unfortunately, the foregoing use of underfill is unworkable for joining two components which are large (typically greater than 25 mm) due to inability of the underfill to flow under such large areas.

Bearing in mind the problems and deficiencies of the prior art, it is therefore an object of the present invention to provide a method for bonding electronic components together, particularly a thin film component to a MLC using solder bumps and reflow, without causing the component to be damaged or distorted or to lose their registration with the corresponding pads to which they are to be connected.

It is another object of the present invention to improve the quality and reliability of electrical connections made between the electronic components being joined particularly a thin film component and a MLC using solder bumps and reflow.

An additional object is to provide electronic component assemblies which are easily and reliably made and have a long operating life and particularly an assembly comprising a thin film electronic component bonded to a MLC using solder bumps and reflow.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a joined electronic component assembly structure having reflowed solder bump attach between the two electronic components which is cost effective and reliable. The structure comprises a carrier component such as a multilayer ceramic substrate (MLC) with a top surface and an array of electrical contact pads patterned on the carrier surface and a multilayer thin film electronic component wherein contact pads on its bottom surface correspond to and are connected to the contact pads on the top surface of the carrier by reflowed solder bumps. A spacer of non-conductive, compliant material is interposed between the bottom surface of the thin film and the top surface of the carrier. The spacer has through-vias (or through-holes) arranged in a pattern corresponding to the array of pad contacts on each component so that one array of pad contacts is on one side of the through-holes and the other array of pad contacts is on the other side of the through-holes. At least one of the electronic components has opposed contact pads, and preferably both components have opposed contact pads, comprising a thick film of metal thereon (typically in the form of a post or other protrusion) which extends above the contact pad surface and extends partly into the through-hole opening of the spacer when the electronic components are joined. After solder-join, the reflowed solder connection extends through the spacer through-holes and connects opposing pairs of pad contacts on the thin film and MLC carrier, with the posts being embedded in the reflowed solder joint. Not all the opposed contact pads of each component need the thick film of metal or post but preferably at least 10% of the pads and most preferably greater than 50% will have the metal or post thereon. It is also preferred that the corresponding pads of each component have the post thereon.

Broadly stated, in an aspect of the invention an electronic component assembly structure is provided, the structure comprising:
    a destination carrier having a top surface with a first array of conductive first contact pads thereon, the first contact pads having posts or other protrusions on at least some of the first contact pads;
    a multilayer thin film structure having a bottom surface connected to the top surface of the destination carrier, the bottom surface having a second array of conductive second contact pads thereon corresponding to and aligned with the first array of first conductive contact pads, the second contact pads having posts or other protrusions on at least some of the second contact pads;
    a spacer of non-conductive, compliant material interposed between the bottom surface of the thin film and the top surface of the destination carrier, the spacer having opposite planar surfaces positioned to oppose the thin film and the destination carrier and the spacer further having a pattern of through-holes extending between the opposite planar surfaces of the spacer to terminate in opposite ends and opposite openings on respective opposite planar surfaces, the pattern of through-holes selected to correspond to the first aligned arrays of the first and second conductive contact pads, the conductive contacts of either of the arrays acting as registration guides for alignment of the spacer with the arrays; and
    solder connections extending in the through-holes, each of the solder connections connecting one of the first contact pads with a corresponding one of the second contact pads, the solder connections being formed by at least one of heat and pressure preferably both.

In another aspect of the invention a process for forming an electronic component assembly structure is provided in which process a multilayer thin film structure is solder joined to a multilayer ceramic substrate each being patterned with lines, vias, and an array of corresponding contact pads on the surface thereof, comprising the steps of:
    forming posts or other protrusions on at least some of the multilayer ceramic substrate contact pads;
    forming solder bumps on the posts of the multilayer ceramic substrate;
    forming posts or other protrusions on at least some of the thin film contact pads;
    optionally forming solder bumps on the posts of the thin film structure, the solder bumps arranged on the thin film in an array corresponding to the array of solder bumps on the multilayer substrate;
    interposing a spacer between the thin film and the substrate, the spacer having through-holes defined therein and arranged in a pattern corresponding to the arrays of solder bumps and contact pads and aligning the pattern of through-holes with the arrays of solder bumps and metal posts or protrusions;
    positioning the posts of the thin film structure opposite to and in alignment with the solder bumps of the multilayer substrate; and
    applying heat and/or pressure, preferably both, to the posts and solder bumps to form new solder connections between the thin film structure and the substrate.

In accordance with another aspect of the present invention, the carrier, to which the thin film is bonded, is either a multilayer ceramic substrate or a laminate structure such as a printed circuit card. The solder connections are formed by reflowing opposing pairs of solder balls and posts on the carrier and the thin film using any solder reflow process such as a closed solder joining process. The thin film is typically built on a first sacrificial carrier, and then further processed by securing it to a second sacrificial carrier. The second sacrificial carrier reduces distortion of, damage to, and surface topography on the thin film during its bonding to the destination carrier and other related processing.

In a related process for forming the joined electronic component assembly structure, the thin film structure is first built on the first sacrificial carrier and then the second sacrificial carrier is secured to the opposite side of the thin film. The first sacrificial carrier is subsequently removed to expose the surface of the thin film which is to be secured to the multilayer ceramic substrate or printed circuit card. Metal layers (e.g., posts) are formed on the pad contacts on the exposed surface of the thin film optionally followed by solder bumps over the posts. Metal layers (e.g., posts) are also formed on pad contacts of the MLC substrate or card followed by solder bumps over the posts and are arranged to correspond to the contact pads and posts of the thin film component. The through-holes of the spacer are also arranged in a pattern corresponding to the arrays of solder bumps and posts on each component to be joined.

The spacer is then placed on either the exposed metal post containing surface of the thin film or on the solder-bump surface of the ceramic substrate or printed circuit card with the through-holes aligned with the metal posts and solder bumps. The solder bumps of the substrate or card are positioned to oppose and align with corresponding metal posts of the thin film, thereby forming opposing pairs of the corresponding metal posts and solder bumps. In one process of solder reflow joining, heat of less than 400° C. and inward pressure of less than 200 psi are applied to the assembly in a closed solder joining process, thereby causing the solder bumps to reflow and form new solder connections between the now joined components. Nonsolder areas are also typically bonded to provide physical support for the thin film. This is typically accomplished using an adhesive layer on the spacer. After the solder connections are formed, the second sacrificial carrier of the thin film is generally removed for attach of a chip or other electronic component to this surface of the thin film structure. The resulting structure comprises a thin film electronic component structure which is mechanically bonded and electrically connected to a MLC substrate or card, and which has been processed using a method which reduces distortion of, damage to, and topography variations on the thin film.

In accordance with another aspect of the present invention, the thin film is adhered to a portion of a printed circuit card to form a region of high wiring density. A chip is then secured to the top surface of the thin film. A spacer is interposed between the card and the thin film which reduces thermal stresses on the chip secured to the thin film and with the contact pad posts of the invention provides a reliable solder reflow bond. Adhesive on the spacer and reflowed solder column patterns can be varied between the spacer, thin film, and laminate card to vary the nature of the solder joints and thermal stress reduction.

In another aspect of the invention, both sides of the spacer have adhesive thereon and are adhered to the corresponding surfaces of the components being joined, e.g., the thin film structure and the MLC. In another aspect, only one side of the spacer has adhesive thereon.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1A:
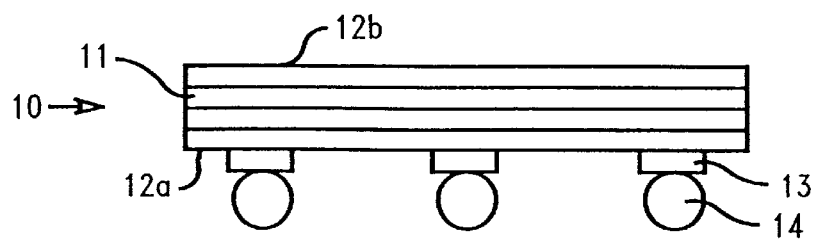
FIGS. 1a–1d are partial schematic views of a prior art thin film structure and multilayer ceramic substrate, with each having pads and solder bumps thereon, and which each are solder joined together using a spacer therebetween.

In describing the preferred embodiment of the present invention, reference will be made herein to FIGS. 1a–3d of the drawings in which like numerals refer to like features of the invention. Features of the invention are not necessarily shown to scale in the drawings.

While the following description will be specifically directed to joining a thin film structure to a multilayer ceramic structure it will be appreciated by those skilled in the art that any two electronic components having corresponding contact pads and solder bumps thereon for joining may be formed using the method of the invention.

Referring now to FIG. 1a, a thin film structure is shown generally as numeral 10. The thin film structure comprises a series of thin film layers shown in composite as 11, and as well known in the art, the layers are interconnected with vias and wiring. The thin film structure is shown so that pads 13 having solder bumps 14 thereon are shown on the lower surface indicated as 12a. The opposed side of the thin film structure is shown as side 12b. This side will typically have contact pads for solder connection to a chip or other electronic component and solder join of the other side 12a.

Figure 1B:
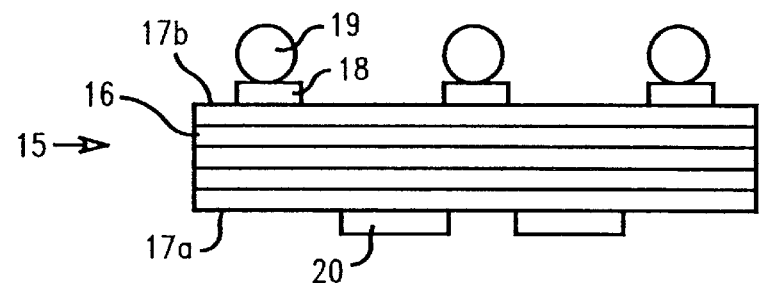

In FIG. 1b, a typical multilayer ceramic structure is shown generally as 15. As with the thin film structure of FIG. 1a, the multilayer ceramic substrate is comprised of a number of layers shown in composite as 16 with each layer being interconnected with vias and wiring. The multilayer ceramic substrate is shown upward so that surface 17b has thereon pads 18 and solder bumps 19. The lower surface of the multilayer ceramic structure shown as 17a has input/output (I/O) pads 20 thereon for interconnection to other electronic components.

Figure 1C:
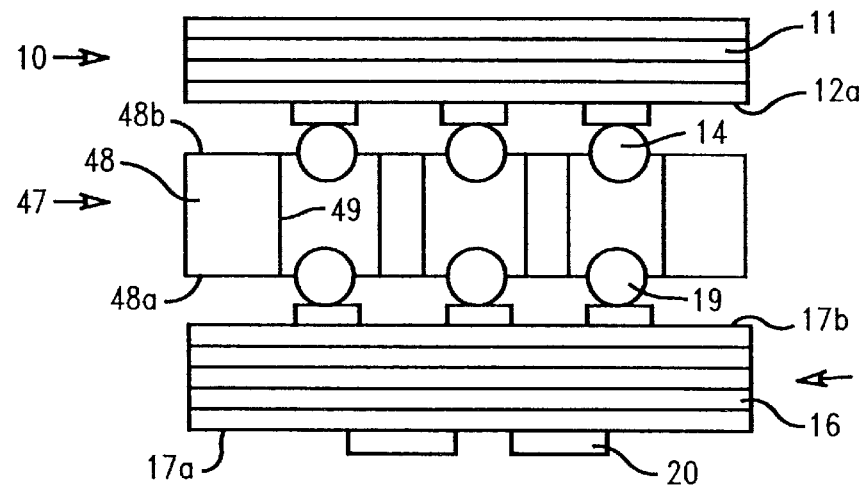

FIG. 1c shows positioning of the thin film structure 11 and the multilayer ceramic substrate 16 with their respective surfaces 12a and 17b and solder bumps 14 and 19 facing each other. A spacer shown generally as 47 comprises a sheet of non-conductive flexible material 48 having through holes or openings 49 therein. The upper surface of the spacer is shown as 48b and the lower surface as 48a. The spacer 48 is interposed between the thin film structure 11 and the multilayer ceramic substrate structure 16 and the respective corresponding solder bumps of each structure are aligned in the through openings 49 of spacer 48.

Figure 1D:
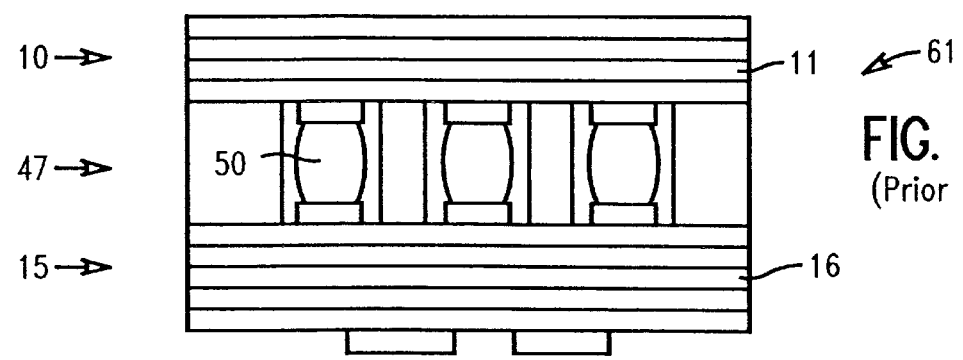

When the thin film structure 11 is to be joined to multilayer ceramic substrate 16, the thin film structure 11, and multilayer ceramic substrate 16 are forced together with spacer 48 therebetween and heat and pressure applied to melt and reflow the solder bumps. The final completed electronic component assembly is shown in FIG. 1d as numeral 61 and it can be seen that the individual solder bumps of each component have reflowed to form a solder bump 50 therebetween which bumps electrically and mechanically join the thin film structure 11 and multilayer ceramic substrate 16 together. Unfortunately the sequence of steps shown is not completely reliable and the method of the invention improves the method of using spacers to join electronic components.

It has been proposed to use a spacer 47 as shown in FIG. 1c when solder joining two electronic components together, and in particular, a thin film structure and a multilayer ceramic substrate. The spacer 47 has an upper surface 48b and a lower surface 48a with through holes 49 extending from the upper surface 48b to the lower surface 48a. The through openings are defined in a pattern corresponding to the opposing solder bumps 14 and 19 of the thin film structure and multilayer ceramic structure, respectively, to be joined. Thus, through holes 49 align and channel the resulting reflowed solder connections 50 between mating surfaces 12a and 17b, respectively, of thin film structure 11 and multilayer ceramic structure 16. The spacer 47 is generally relatively thick compared to the thin film structure 11 and, in general, the spacer ranges between 1 and 10 mils in thickness with about 2 mils being preferable for most applications. The size of the through-holes may vary and are generally about 0.5 to 5 mils greater than the size of the contact pad of the component to be joined.

As can be seen in FIG. 1c, the spacer 47 was placed on the upper surface 17b of multilayer ceramic substrate 16 so that through holes 49 registered with the solder balls 19 of the multilayer ceramic structure. Likewise, the solder balls 14 of the thin film structure 11 were placed on the opposed surface 48b of the spacer in registration with through holes 49.

Figure 2A:
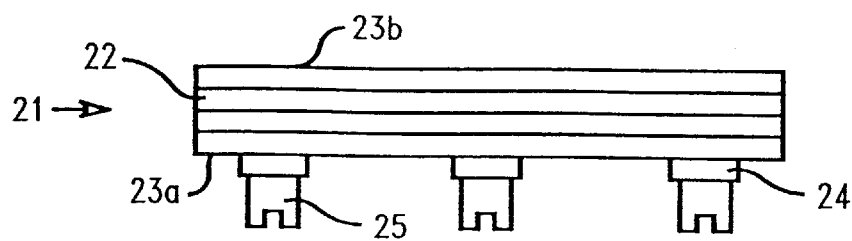
FIGS. 2a–2d are partial schematic views of a thin film structure and multilayer ceramic substrate, according to the present invention, with the thin film structure having contact pads and metal posts thereon and the MLC having contact pads with metal posts and solder bumps thereon, and which each are solder joined together using a spacer therebetween.

Referring now to FIGS. 2a–2d, a method and electronic component assembly structure of the invention is shown. In FIG. 2a a thin film structure shown generally as 21 comprises a series of layers of interconnected vias and wiring shown in composite as numeral 22. The structure is shown positioned with surface 23a down and opposed surface 23b up. Contact pads 24 contain a post 25 thereon. It will be noted that the post has a U-shape in its free end surface but any type shape such as a cylinder may be used for the post as shown below with regard to the multilayer ceramic substrate of FIG. 2b.

Figure 2B:
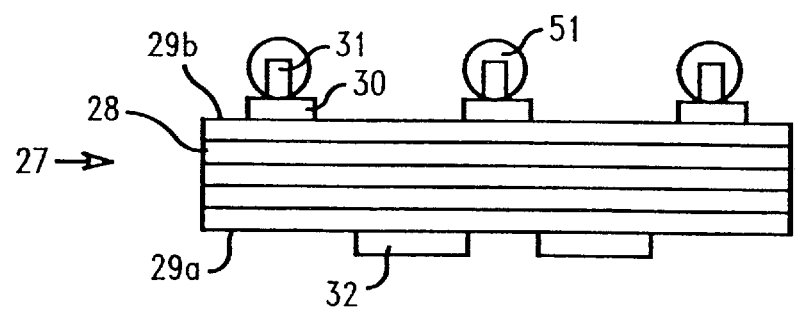

Referring now to FIG. 2b, a multilayer ceramic substrate is shown generally as 27 and comprises a series of layers containing interconnected vias and wiring which is shown as numeral 28 in composite. The lower surface 29a has I/O pads 32 thereon and the upper surface 29b has contact pads 30 thereon. Cylindrical posts 31 are formed on the contact pads 30 and a solder bump 51 formed over the posts 31 and pads 30.

It is preferred to use solder bumps on only one of the components as shown in FIGS. 2a and 2b although solder bumps could be used on both components if desired. It is highly preferred to use posts on the contact pads of both components as shown in FIGS. 2a and 2b although posts on only one component may be used for certain applications.

Figure 2C:
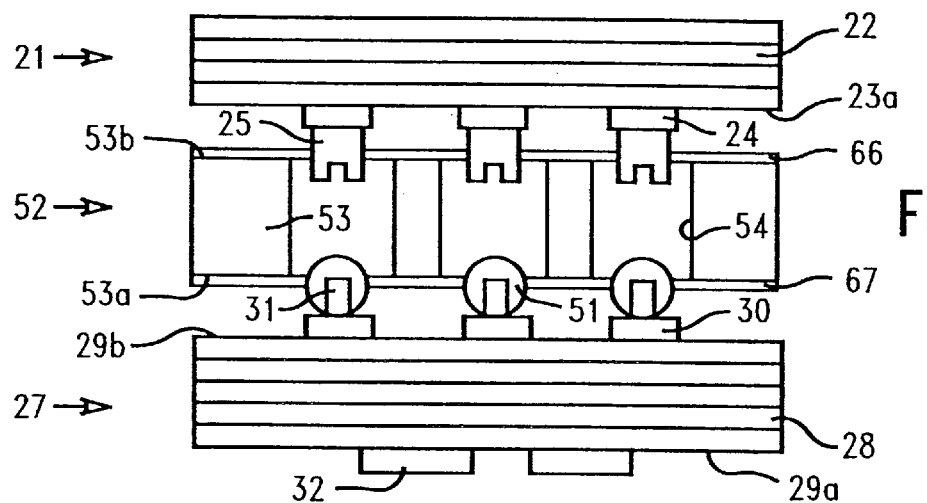

Referring to FIG. 2c, the multilayer ceramic substrate is positioned with a spacer shown generally as 52 between the multilayer ceramic substrate 28 and thin film structure 22. The spacer 52 comprises a flexible non-conductive material shown as 53 and has through-holes 54. The through-holes correspond with the pads 24 on the thin film structure and the pads 30 of the multilayer ceramic substrate 28. As shown in FIG. 2c, the lower surface 53a of spacer 53 is opposed to surface 29b of multilayer ceramic substrate 28 and has an adhesive coating 67 thereon. Similarly, the upper surface 53b of spacer 53 is shown opposed to surface 23a of thin film structure 22 and has an adhesive coating 66 thereon. The solder bumps 51 of the multilayer ceramic substrate and posts 25 of the thin film structure are aligned in their corresponding through-holes 54 as shown in FIG. 2c.

Figure 2D:
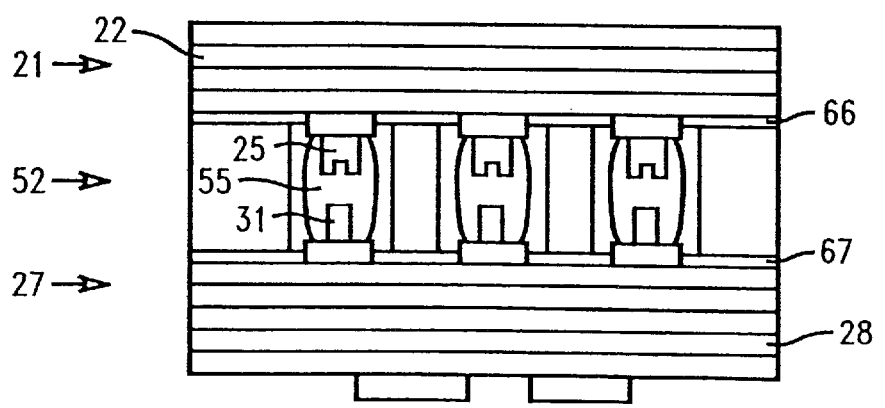

FIG. 2d shows the structure of FIG. 2c after the solder bumps have been reflowed forming new solder joints 55 joining the contact pads 24 of the thin film structure 22 to the contact pads 30 of the multilayer ceramic substrate 28 as numeral 62. As can be seen from FIG. 2d, the solder joints 55 have embedded in them the contact posts 25 of the thin film structure and contact posts 31 of the multilayer ceramic substrate 28. Such posts on the contact pads have been found to provide stability and reliable registration during the electronic assembly process. The posts on the contact pads also restrains the organic spacer layer from over expanding during reflow heating. It is important that the end of the post extend partly into the through-hole of the spacer and preferably past the adhesive layer.

Spacer 53 has a much higher coefficient of thermal expansion (CTE) typically 25 to $60 \times 10^{-6}/^\circ$ C. than the sacrificial glass carrier on which the thin film is fabricated on the chip carrier 28. Therefore, a heated spacer expands much more than the carrier substrate thereby creating misalignment to joining pads to the through holes 54 in the spacer. This misalignment is worse at the outer edges of the substrate due to greater distance from the central point The protruding studs which partially extend into the through holes 54 physically restrain the spacer from expanding thereby keeping the joining pads in alignment.

The posts on the contact pads may be formed using any suitable material and it is preferred to use a metal such as nickel, copper or gold or a combination of these metals to a thickness which is above the adhesive layer thickness of the spacer layer. Spacer 53 has adhesive layers 66 and 67 of a thickness of 1 to 25 microns on each surface. The use of an adhesive on spacer 53 is highly preferred in building a reliable interconnect structure. It is highly preferred that spacer 53 be bonded to the carrier substrate and to the thin film by means of adhesives during the forming process. Adhesive layers 66 and 67 are typically the same material. A preferred spacer has an adhesive on both sides and is a thermoplastic such as KAPTON®EKJ made by DuPont. Any suitable material can be used as the spacer and adhesive and both are typically organic materials (e.g., polymeric) and thermoplastic.

The posts need not be the width of the contact pad but may be as wide for certain applications. Typically the posts will be about 20% to 90% of the diameter of the contact pad and about 0.3 to 1.5 mils high. Normally the spacer layer will have an adhesive layer on each side thereof to bond the spacer to the electronic component. It is an important aspect of the invention that the height of the post be such that the top of the post extends beyond the adhesive layer and into the though-hole of the spacer. This has been found to provide enhanced registration of the electronic components being joined by restraining the expansion of organic layer during a heating cycle.

It is not necessary that all the joining contact pads of each component be plated or otherwise formed with posts or increased metal thicknesses. A sufficient number of joining pads containing the posts and which are preferably strategically placed in the pad array will provide the desired registration and process efficiencies. It is highly preferred that corresponding contact pads of each component being joined have posts thereon. For example, corresponding posts on the outer periphery contact pads of the thin film and the multilayer ceramic substrate may be sufficient for some applications to provide the proper registration.

The organic spacer layer is anchored by the thick metal protrusions or posts on the contact pads and electronic assemblies have been successfully made using such a structure. If the metal posts or protrusions are not present, the organic spacer layer is not as effective. Without the post containing pad structure, joining of the thin film to a ceramic carrier would not be successful and an electrically defective electronic assembly would result.

Figure 3A:
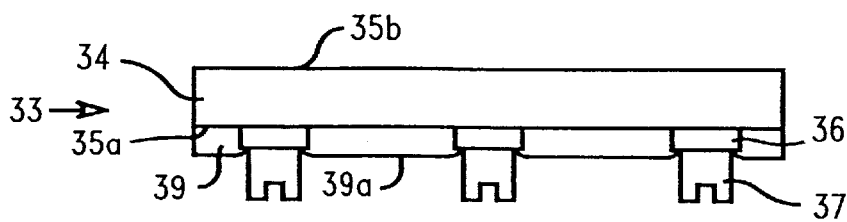
FIGS. 3a–3d are partial schematic views of another thin film structure and multilayer ceramic substrate according to the present invention with the thin film structure having contact pads and metal posts thereon and the MLC having contact pads with metal posts and solder bumps thereon and both have a thin polyimide layer surrounding the contact pads and metal posts, and which each are solder joined together using a spacer therebetween.

Referring now to FIGS. 3a–3d, another method and structure of the invention is shown. In FIG. 3a, a thin film structure shown generally as 33 comprises a series of layers of interconnected vias and wiring shown in composite as numeral 34 (but without layer lines for clarity). The structure is shown positioned downward as surface 35a with opposed surface 35b. Pads 36 contain a post 37 thereon. It will be noted as in FIGS. 2a–2d that the post 37 has a U-shape in the free surface thereof but that any shape post may be used as shown below with regard to the multilayer ceramic substrate of FIG. 3b. A thin layer of polyimide material 39 is formed on the surface 35a of the thin film structure 34. This thin film of polyimide surrounds the pads 36 and posts 37.

Figure 3B:
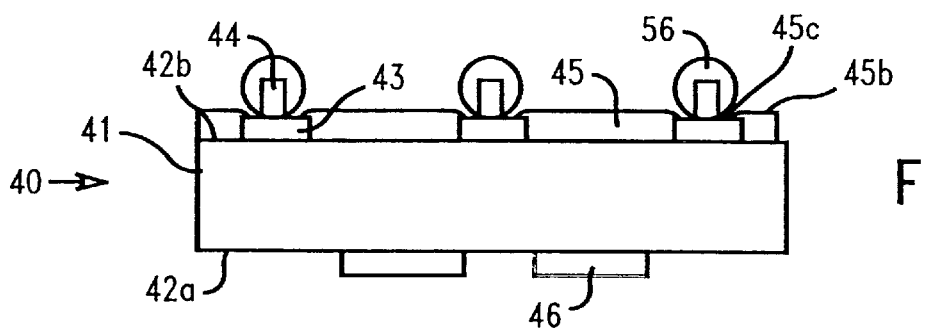

Referring now to FIG. 3b, a multilayer ceramic substrate is shown as 40 and comprises a series of layers containing interconnected vias and wiring which is shown as numeral 41 in composite (but without layer lines for clarity). The lower surface 42a has I/O pads 46 thereon and the upper surface 42b has contact pads 43 thereon. Posts 44 are formed on the contact pads 43 and a solder bump 56 formed over the posts 44 and pads 43. A thin film of polyimide or other material 45 is formed on the surface 42b of MLC structure 41 typically before the posts 44 are formed and a via hole 45c is formed in the polyimide layer on top of contact pads 43 exposing the contact pads. The metal posts 44 are then formed by conventional methods. These metal posts cover the via hole. Solder bumps 56 are formed on the metal posts 44. Similar via holes may be formed on the pads of the thin film structure followed by forming the metal posts 37.

Figure 3C:
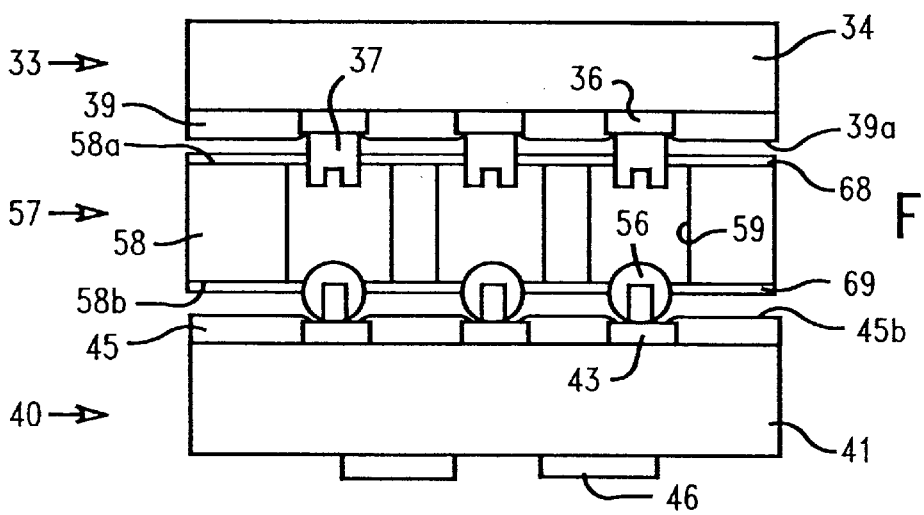

Refering to FIG. 3c, the multilayer ceramic substrate 41 is positioned with a spacer shown generally as 57 between the multilayer ceramic substrate 41 and thin film structure 34. The spacer 57 comprises a flexible non-conductor material shown as 58 and has a series of through-holes 59. The through-holes 59 correspond with the pads 43 on the multilayer ceramic substrate 41 and the pads 36 on the thin film structure 34. As shown in FIG. 3c, the lower surface 58b of spacer 58 is opposed to surface 45b of MLC 41. Similarly, the upper surface 58a of spacer 58 is opposed to surface 39a of thin film structure 34. Each surface of the spacer has an adhesive layer thereon shown as 68 and 69. The metal posts 37 of the thin film structure 34 and solder bumps 56 of the multilayer ceramic substrate 41 are aligned in their corresponding through-holes 59 as shown in FIG. 3c.

Figure 3D:
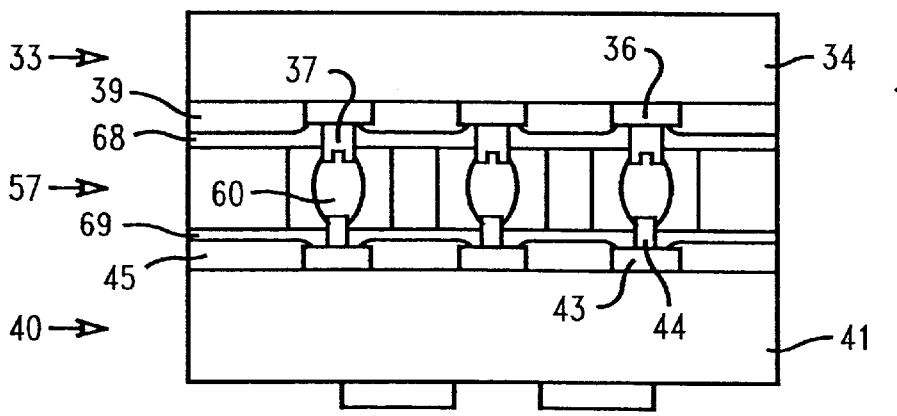

FIG. 3d shows the structure of FIG. 3c as numeral 63 after the solder bumps have been reflowed forming new solder joints 60 joining the contact pads 36 of the thin film structure 34 to the contact pads 43 of the multilayer ceramic substrate structure 41. As can be seen from FIG. 3d, the solder joints 60 have embedded in them the posts 37 of the thin film structure and posts 44 of the MLC. Such posts on the contact pad provide stability and reliable registration during the electronic assembly process. As with the structure shown in FIGS. 2a–2d, the formation of posts on the contact pads restrain the organic spacer layer from over-expanding during heating.

While the present invention has been particularly described, in conjunction with a specific preferred embodiment, it is evident that many alternatives, modifications and variations will be apparent to those skilled in the art in fight of the foregoing description. It is therefore contemplated that the appended claims will embrace any such alternatives, modifications and variations as falling within the true scope and spirit of the present invention.

Thus, having described the invention, what is claimed is:

1. An electronic component assembly structure, the structure comprising:
    a destination carrier having a top surface with a first array of first conductive contact pads thereon, the first contact pads having posts or other protrusions on at least some of the first contact pads;
    a multilayer thin film structure having a bottom surface connected to the top surface of the destination carrier, the bottom surface having a second array of second conductive contact pads thereon corresponding to and aligned with the first array of conductive contact pads, the second contact pads having posts or other protrusions on at least some of the second contact pads;
    a spacer of non-conductive, compliant material interposed between the bottom surface of the thin film and the top surface of the destination carrier, the spacer having opposite planar surfaces positioned to oppose the thin film and the destination carrier, the spacer further having a pattern of through-holes extending between the opposite planar surfaces of the spacer to terminate in opposite ends and opposite openings on respective opposite planar surfaces, the pattern of through-holes selected to correspond to the first and second aligned arrays of the first and second conductive contact pads, the posts or other protrusions of either of the arrays acting as registration guides for alignment of the spacer with the arrays; and
    solder connections extending in the through-holes, each of the solder connections connecting one of the first contact pads of the first array with a corresponding one of the second contact pads of the second array.

2. The structure of claim 1 wherein at least one of the planar surfaces of the spacer has an adhesive layer thereon.

3. The structure of claim 2 wherein the height of the posts or protrusions is greater than the thickness of the adhesive layer.

4. The structure of claim 1 wherein the posts or other protrusions of the destination carrier have solder bumps thereon.

5. The structure of claim 1 wherein the destination carrier is selected from the group consisting of a multi-layer ceramic substrate and a laminate card.

6. The structure of claim 1 wherein the spacer is formed from an organic material and has a thickness of up to about 10 mils.

7. The structure of claim 1 wherein all the pads of the carrier and thin film structure have posts thereon.

8. A process for forming an electronic component assembly structure in which process a multilayer thin film structure is solder joined to a destination carrier each being patterned with lines, vias, and an array of corresponding contact pads, comprising the steps of:
    forming posts or other protrusions on at least some of the destination carrier contact pads;
    forming solder bumps on the posts of the destination carrier;
    forming posts on at least some of the thin film structure contact pads;
    interposing a spacer between the thin film structure and the destination carrier, the spacer having through-holes defined therein and arranged in a pattern corresponding to the arrays of solder bumps and contact pads and aligning the pattern of through-holes with the arrays of solder bumps and metal posts or protrusions;
    positioning the metal posts or protrusions of the thin film structure opposite to and in alignment with the solder bumps of the destination carrier; and
    reflowing the solder bumps to form solder connections between the thin film contact pads and the destination carrier contact pads.

9. The process of claim 8 further comprising the step of forming the spacer of compliant, non-conductive material having a thickness up to about 10 mils.

10. An electronic component assembly structure made by the process of claim 9.

11. The process of claim 8 wherein the destination carrier is a multi-layer ceramic or printed circuit board.

12. An electronic component assembly structure made by the process of claim 11.

13. The process of claim 8 wherein the spacer has an adhesive on both sides thereof.

14. An electronic component assembly structure made by the process of claim 13.

15. An electronic component assembly structure made by the process of claim 8.

* * * * *